(12) United States Patent
Acharya et al.

(10) Patent No.: US 6,438,058 B2
(45) Date of Patent: Aug. 20, 2002

(54) INTEGRATED CIRCUIT CONTAINING A NUMBER OF SUBCIRCUITS

(75) Inventors: Pramod Acharya, München; Andreas Täuber, Unterschleissheim, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/761,242

(22) Filed: Jan. 17, 2001

(30) Foreign Application Priority Data

Jan. 17, 2000 (DE) .......................................... 100 01 648

(51) Int. Cl.$^7$ ................................................. G11C 7/00
(52) U.S. Cl. ................................. 365/225.7; 365/230.02
(58) Field of Search ............................. 365/191, 225.7, 365/230.06, 230.02

(56) References Cited

U.S. PATENT DOCUMENTS 5,553,021 A    9/1996  Kubono et al. ........ 365/185.33
5,721,834 A *  2/1998  Milhaupt et al. ........... 395/280
6,204,700 B1 * 3/2001  Seyed ......................... 327/108

FOREIGN PATENT DOCUMENTS

EP     0 945 868 A2    9/1999

\* cited by examiner

*Primary Examiner*—David Nelms
*Assistant Examiner*—Thong Le
(74) *Attorney, Agent, or Firm*—Laurence A. Greenberg; Werner H. Stemer; Gregory L. Mayback

(57) ABSTRACT

An integrated circuit containing a number of subcircuits is described. Each of the subcircuits contains a driver circuit for driving in each case one controllable voltage source on the basis of a reference value. The driver circuit has a memory unit for storing a reference value and a terminal for outputting a first reference value or for inputting a second reference value. A signal line, which is used for transmitting a signal, is connected to the terminal of the driver circuit of each of the subcircuits. The driving by the driver circuit is effected in each subcircuit on the basis of a common reference value that is transmitted via the signal line. Thus, the time needed for setting the reference values for all subcircuits is relatively short.

13 Claims, 1 Drawing Sheet

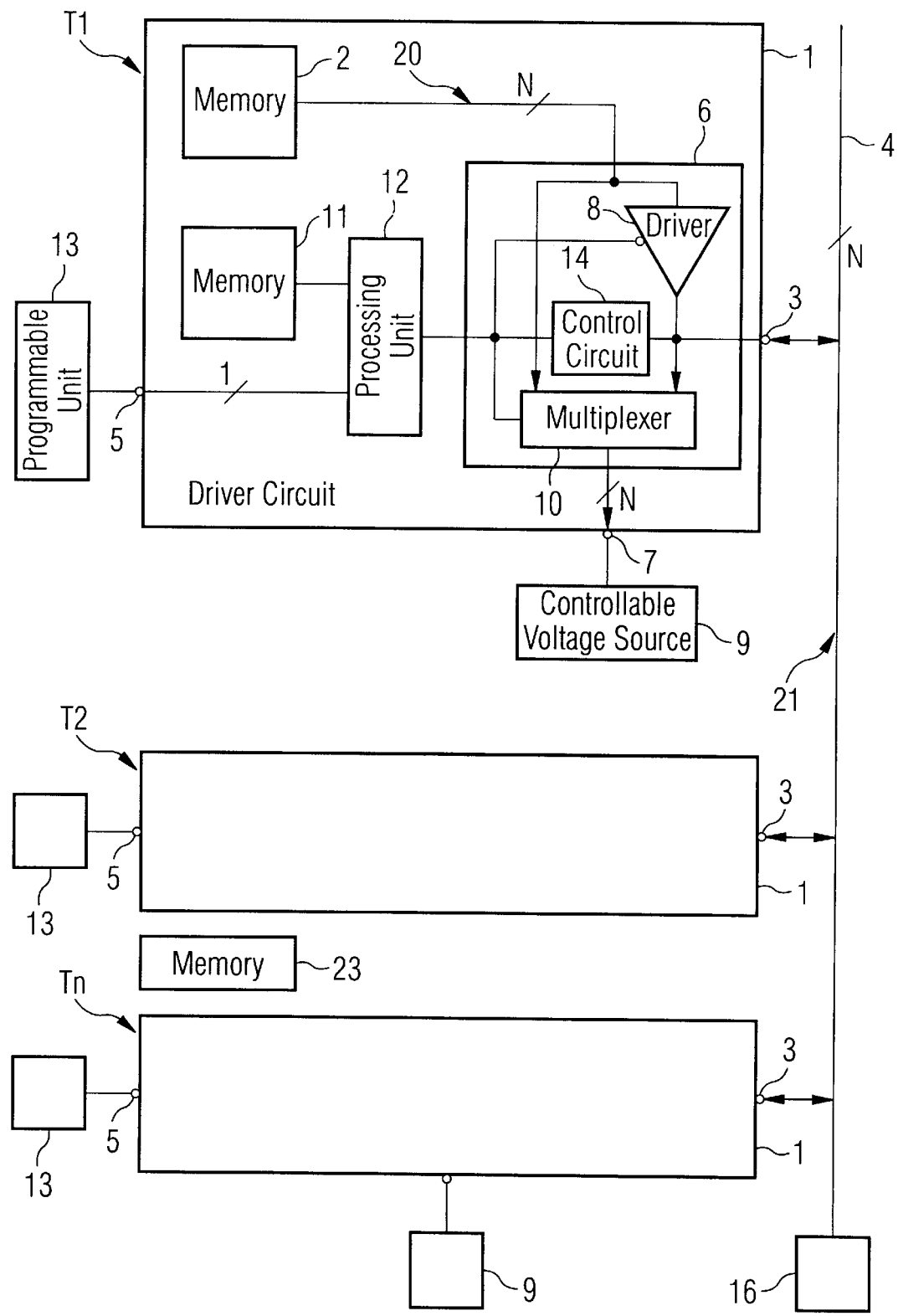

INTEGRATED CIRCUIT CONTAINING A NUMBER OF SUBCIRCUITS

BACKGROUND OF THE INVENTION

Field of the Invention

The present invention relates to an integrated circuit containing a number of subcircuits, in which each of the subcircuits has a drive circuit for driving in each case at least one controllable voltage source on the basis of a reference value.

Integrated circuits frequently exhibit a number of subcircuits for certain applications, which subcircuits are integrated into one system on a chip. Such subcircuits can be, for example, memory circuits that are constructed, for example, as dynamic random access memory circuits, so-called DRAMs. Such memory circuits are also called "embedded DRAMs", eDRAMs for short. To be able to use such memory circuits in a multiplicity of applications, they are structured as modules in most cases. Thus, each of the memory circuits exhibits, for example, a circuit configuration for supplying its own voltage.

In the operation of the integrated circuit, a supply voltage of an eDRAM memory circuit should assume a value defined in the configuration process. When this value is set, influences of the operating voltage of the integrated circuit, process fluctuations and temperature fluctuations, in particular, must be taken into consideration. Such memory circuits, therefore, have drive circuits via which the respective supply voltage can be set in each case within a certain range by a reference value. Therefore, the respective value of the supply voltage is in each case set separately for each of the subcircuits, and thus adapted, during the production of an integrated circuit containing a number of subcircuits. For this purpose, the reference value is suitably changed for each of the subcircuits in such a manner that, for example, the influence of process fluctuations is compensated for. At least one controllable voltage source, the so-called "bandgap source", is driven via the respective drive circuit, which is also called a so-called "bandgap reference". The voltage source is trimmed on the basis of the reference value of the respective driver circuit in such a manner that the supply voltage corresponds to the predetermined value even when the parameters of the integrated circuit change as a consequence of process fluctuations.

The reference value is stored, for example, in each of the subcircuits. For this purpose, the respective driver circuit has a memory unit that contains, for example, programmable elements in the form of laser fuses. The reference value can be set in each of the memory units by individual programming of the laser fuses. For this purpose, a so-called laser cutter is placed in a suitable position for each of the subcircuits in order to program the laser fuses of each of the memory units during the production of the integrated circuit. If the integrated circuit exhibits a multiplicity of subcircuits for which the reference value must be programmed in each case for setting the supply voltage, the time needed for producing the integrated circuit increases noticeably since the laser must be set with new coordinates for each of the subcircuits.

SUMMARY OF THE INVENTION

It is accordingly an object of the invention to provide an integrated circuit containing a number of subcircuits which overcomes the above-mentioned disadvantages of the prior art devices of this general type, in which the period of time needed for setting the respective reference values of the subcircuits is relatively short.

With the foregoing and other objects in view there is provided, in accordance with the invention, an integrated circuit. The integrated circuit contains controllable voltage sources and a number of subcircuits connected to the controllable voltage sources. Each of the subcircuits includes a driver circuit for driving in each case at least one of the controllable voltage sources in dependence on a reference value. The driver circuit has a memory unit for storing a first reference value and at least one terminal for outputting the first reference value and for inputting a second reference value. A signal line is provided for transmitting at least one signal and is connected to the terminal of the driver circuit of each of the subcircuits.

The object is achieved by an integrated circuit containing a number of subcircuits. Each of the subcircuits contains a driver/control circuit for driving in each case at least one controllable voltage source (i.e. controllable bandgap source) on the basis of a reference value. The driver circuit has a memory unit for storing the (first) reference value and at least one terminal for outputting the reference value or for inputting a further (second) reference value. A signal line for transmitting at least one signal, which line is connected to the terminal of the driver circuit of each of the subcircuits.

The integrated circuit according to the invention enables the respective reference values of all subcircuits or, respectively, driver circuits to be set almost simultaneously. In this configuration, it is assumed that the process technology within the integrated circuit is subject to only relatively insignificant fluctuations in comparison with process fluctuations over the entire wafer or in various production batches. Controllable voltage sources are therefore driven by the driver circuit of each subcircuit on the basis of a common reference value of the integrated circuit. This reference value is transmitted over the signal line that is connected to the driver circuit of each of the subcircuits.

For this purpose, a so-called master/slave concept is used. A subcircuit or, respectively, its driver circuit is selected which, as the so-called master, determines the respective reference value and transmits it to the signal line. The other subcircuits of the integrated circuit or, respectively, their driver circuits, as so-called slaves, receive the reference value of the master driver circuit via the signal line. The reference value to be transmitted is stored in the memory unit of the master driver circuit. This reference value is output to the signal line via a terminal of the driver circuit. The reference value present on the signal line is input by the slave driver circuit via a corresponding terminal. These drive the respective voltage sources on the basis of the reference value input.

In the interest of achieving the greatest possible modularity, each of the driver circuits of the subcircuits in each case has the memory unit for storing the reference value and a terminal which is used either for outputting the stored reference value or for inputting a reference value to be input. Each of the driver circuits can, therefore, be used both as the master driver circuit and as the slave driver circuit. In this configuration, it can be established in advance, for example, in the configuration process which of the driver circuits acts as the master driver circuit and which of the driver circuits act as the slave driver circuits.

The integrated circuit according to the invention distinctly shortens the time taken for programming the reference values since it is now only necessary to program the programmable elements of the master driver circuit, for example by use of a laser. Since all driver circuits have the same structure, extensive modularity of the subcircuits is ensured. Therefore, the memory unit has programmable elements in the form of laser fuses.

Since the reference value is generally present as a logic value and this value only needs to be output once to the signal line for transmission, the signal line is suitably constructed as a static logical signal bus for transmitting a logical signal. In contrast to, for example, an analog bus for transmitting a stable supply voltage, this bus does not need to be shielded which brings about noticeable advantages in the production of the integrated circuit. One of these advantages is generally that a shorter time is required in the configuration process of the integrated circuit since, furthermore, unrestricted automatic wiring is possible during the production of the integrated circuit.

In a further development of the invention, the integrated circuit has the driver circuits with a respective input for setting whether the terminal of the driver circuit is used for outputting the stored (first) reference value or for inputting the (second) reference value to be input. The above-mentioned presetting of which of the driver circuits acts as the master driver circuit or, respectively, as the slave driver circuit, can be cancelled or altered via this input. For example, the input of the driver circuit is connected to a programmable unit that is located outside the respective subcircuit. This unit delivers a corresponding electrical signal to the driver circuit which signal decides about the mode of the respective driver circuit. When the corresponding inputs of the driver circuit are wired up, it must be ensured that only one of the driver circuit acts as the master driver circuit.

In an embodiment of the invention, the driver circuit contains a selection circuit for switching between outputting of the stored reference value and inputting the reference value to be input. Appropriate driving of the selection circuit makes it possible to use the terminal of the driver circuit both for outputting the stored reference value and for inputting the reference value to be input.

In a further development of the invention, the driver circuit has an output for driving one of the controllable voltage sources. The selection circuit also contains a further driver circuit that is connected between the memory unit and the connection of the driver circuit. A multiplexer circuit is connected at the output to the output for driving one of the controllable voltage sources and at the input in each case to the memory unit and to the connection of the driver circuit. In master mode the reference value stored in the memory unit is output to the signal line via the terminal of the driver circuit by appropriately driving the further driver circuit. Moreover, the stored reference value is delivered, by appropriately driving the multiplexer circuit, to the output of the driver circuit that, in turn, drives at least one of the controllable voltage sources on the basis of the reference value. In the slave mode, the reference value to be input from the signal line is delivered to the output of the driver circuit reference via the multiplexer circuit. This value is then used for driving the respective controllable voltage source.

In a further development of the invention, the driver circuit has a further memory unit via which it is possible to set whether the connection of the driver circuit is deactivated. Thus, further functions can be activated with the aid of the further memory unit. For example, it is possible to set via the further memory unit whether the respective subcircuit is operated with the global trimming of the respective driver circuit as described (global operating mode). If this is so, the further memory unit does not affect any change with respect to the above-mentioned presetting (no programming of the further memory unit), if not, the terminal of the driver circuit is deactivated by an appropriate drive signal. Therefore, the respective driver circuit is isolated from the signal line and correspondingly operates in a local operating mode, or the corresponding driver circuit is completely deactivated.

Thus, the further memory unit makes it possible to respond flexibly to changes during the production of the integrated circuit or after the production of the integrated circuit. The prerequisite for this is that the respective subcircuits or, respectively, their driver circuits can be operated, as described, both in the global operating mode and in the local operating mode. The global operating mode is preset, for example, in the further memory unit in each of the driver circuits and can be changed by appropriately programming the further memory unit in each of the driver circuits. For this purpose, the further memory unit also has, for example, programmable elements in the form of laser fuses.

By providing the further memory unit, a type of fallback system is thus created in which, in the case of unexpected problems, for example in the production (with a consequence of, for example, comparatively large fluctuations of the supply voltage within the integrated circuit), each of the subcircuits or, respectively, the driver circuits can be operated either in the local operating mode or is completely deactivated. Moreover, the information stored in the further memory units can be used for performing an analysis at a later time, for example for determining which of the subcircuits are deactivated. If certain subcircuits or, respectively, their driver circuits are operated in the local operating mode, it is necessary to program their memory units with a corresponding reference value. As a consequence, the time advantage achieved by the global operating mode is correspondingly narrowed down.

In accordance with an added feature of the invention, the terminal of the driver circuit is activated only once when the integrated circuit is taken into operation.

In accordance with an additional feature of the invention, the signal transmitted on the signal line exhibits only one active phase.

In accordance with a further feature of the invention, a further component is provided, and the signal line is connected to the further component.

In accordance with a concomitant feature of the invention, at least one of the subcircuits has a dynamic random access memory circuit.

Other features which are considered as characteristic for the invention are set forth in the appended claims.

Although the invention is illustrated and described herein as embodied in an integrated circuit containing a number of subcircuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE the drawing is a block circuit diagram of an integrated circuit.

DESCRIPTION OF THE PREFERRED EMBODIMENTS

Referring now to the single FIGURE of the drawing, there is shown an embodiment according to the invention of a driver/control circuit 1 of in each caige a number of subcircuits T1, T2 and Tn of an integrated circuit. Each of the subcircuits T1, T2 and Tn contains the driver circuit 1 for driving in each case at least one controllable voltage source 9 (i.e. a band gap source). The driver circuit 1 of the subcircuit T1 is here used for driving the controllable voltage source 9. The driver circuit 1 has a memory unit 2 for storing a reference value 20. The integrated circuit contains a signal line 4 for transmitting at least one signal, which is connected to each of the driver circuits 1 via the terminals 3.

The terminal 3 of the driver circuit 1 is used for outputting the reference value 20 to the signal line 4 or for inputting a further reference value 21 into the driver circuit 1. The driver circuit 1 also exhibits an input 5 which, for example, is connected to an external programmable unit 13. It is possible, via a logical processing unit 12 and a selection circuit 6, to set or determine, via an appropriate signal at the input 5, whether the terminal 3 of the driver circuit 1 is used for outputting the reference value 20 or for inputting a further reference value 21. The reference value 20 is stored in the memory unit 2, for example via programmable elements in the form of laser fuses.

The selection circuit 6 is used for switching between outputting the reference value 20 to the terminal 3 and, respectively, inputting the reference value 21. In this configuration, the output of the reference value 20 is controlled via a further circuit 8 which is connected between the memory unit 2 and the terminal 3 of the driver circuit 1. The selection circuit 6 also contains a multiplexer circuit 10, the output of which is connected to an output 7 for driving the controllable voltage source 9 and an input of which is in each case connected to the memory unit 2 and to the terminal 3 of the driver circuit 1.

The driver circuit 1 also contains a further memory unit 11. It is possible, by the further memory unit 11, via the logical processing unit 12 and the selection circuit 6, to determine whether the terminal 3 of the drive circuit 1 is deactivated. The further memory unit 11 has programmable elements in the form of laser fuses, for example like the memory unit 2. Additionally, the subcircuit T1 may be associated with a dynamic random access memory circuit 23.

In the text that follows, the operation of the circuit configuration will be explained in greater detail.

The external programmable unit 13 is used for presetting via a corresponding electrical signal whether the driver circuit 1 of the respective subcircuit T1 to Tn is in a master mode or a slave mode, respectively. The external programmable units 13 are appropriately preset, for example in the configuration process of the integrated circuit. During this process, attention must be paid to the fact that only one of the subcircuits T1 to Tn is operated in the master mode. This presetting, in which one of the subcircuits T1 to Tn or, respectively, its driver circuit 1 is in the master mode and the driver circuit 1 of the remaining subcircuits T1 to Tn are in the slave mode, is also called the so-called default setting.

If the driver circuit 1 is in master mode, the circuit 8 is correspondingly activated and the reference value 20 is thus output to the signal line 4 via the terminal 3. At the same time, the controllable voltage source 9 is driven with the reference value 20 via the multiplexer circuit 10 via a further signal path. In this configuration, the reference value 20 exhibits a signal bit size of N bits, the number of which is determined from the number of steps by which the reference value 20 can be set. Correspondingly, the signal line 4 also has a signal bit size of N bits. Similarly, the selection circuit 6 is present N times, each individual selection circuit 6 being connected to in each case one single bit line.

If the slave mode is preset via the external programmable unit 13, the circuit 8 is correspondingly deactivated. Accordingly, the multiplexer circuit 10 is driven via the logical processing unit 12 in such a manner that the controllable voltage source 9 is controlled on the basis of the further reference value 21 present on the signal line 4. The circuit 8 is implemented, for example, as a so-called tristate driver 8. In the deactivated state, it has a high impedance. In operating cases in which the signal line 4 is not activated, a control circuit 14 via which the signal line 4 is connected, for example, to a fixed reference potential, is provided to avoid floating states on the signal line 4.

In the further memory unit 11, a so-called signal vector can be programmed via which other functions can be set. If the driver circuit 1 is preset, for example, for the master mode, it is possible to set, via the memory unit 11, whether the driver circuit 1 is operated in the global operating mode as intended, or not. In the case where the driver circuit 1 is operated in the global operating mode, no further setting is required in the memory unit 11, and in the other case, the memory unit 11 is appropriately programmed and the driver circuit 1 is operated in the local operating mode.

If the driver circuit 1 is preset for the slave mode via the external programmable unit 13, two other functions can be set in addition to the default setting for the global operating mode. For example, the driver circuit 1 is not operated in the global operating mode as a result of which there is no local operation, either, due to the slave presetting. In a second function, the driver circuit 1 is also not operated in the global operating mode. In addition, however, the relevant driver circuit 1 is switched into the master mode as a result of which local operation takes place. For this purpose, however, it is necessary that the memory unit 2 of the locally operated driver circuit 1 is programmed for setting a corresponding reference value 20. The reference value 20 is not needed in the global operating mode since the respective reference value 21 present on the signal line 4 is used for setting the controllable voltage source 9.

To set the functions that can be set via the further memory unit 11, the circuit 8 and the multiplexer circuit 10 are driven in a suitable manner. Correspondingly, the terminal 3 for outputting or, respectively, inputting the reference value is activated in the case of the global operating mode and the terminal 3 of the driver circuit 1 is not used for transmitting the reference value in the case of the local operating mode.

For example, the terminal 3 of the driver circuit 1 is activated only once when the integrated circuit is taken into operation. The further reference value 21 is thus present only once on the signal line 4 when the integrated circuit is taken into operation. It is also possible that the signal transmitted on the signal line 4 has, for example, only one active phase. Trimming information is then exchanged only during the active phase of the signal.

The signal line 4 can thus also be used for transmitting other signals in the remaining operating time. For this purpose, the signal line 4 is connected, for example, to a further component 16 of the integrated circuit which uses the signal line 4 for transmitting other signals which are not used for driving the controllable voltage source 9 of one of the subcircuits.

We claim:

1. An integrated circuit, comprising:
   controllable voltage sources; and
   a number of subcircuits connected to said controllable voltage sources, each of said subcircuits including:
   a driver circuit for driving in each case at least one of said controllable voltage sources in dependence on a reference value, said driver circuit having a memory unit for storing a first reference value and at least one terminal for outputting the first reference value and for inputting a second reference value; and a signal line for transmitting at least one signal and connected to said at least one terminal of said driver circuit of each of said subcircuits.

2. The integrated circuit according to claim 1, wherein said signal line is constructed for transmitting a logical signal.

3. The integrated circuit according to claim 1, wherein said memory unit has programmable elements, and said programmable elements are laser fuses.

4. The integrated circuit according to claim 1, wherein said driver circuit has an input for setting whether the terminal of the driver circuit is used for outputting the first reference value or for inputting the second reference value.

5. The integrated circuit according to claim 1, wherein said driver circuit has a selection circuit for switching between outputting the first reference value and inputting the second reference value.

6. The integrated circuit according to claim 5, wherein:

said driver circuit has an output connected to and driving said at least one of said controllable voltage sources;

said selection circuit has a further driver circuit connected between said memory unit and said terminal; and said selection circuit further has at least one multiplexer circuit with an output connected to said output of said driver circuit and an input connected to said memory unit and to said terminal.

7. The integrated circuit according to claim 1, wherein said driver circuit has a further memory unit for setting whether the terminal of said driver circuit is activated or deactivated.

8. The integrated circuit according to claim 7, wherein said further memory unit is preset such that the terminal of said driver circuit is activated.

9. The integrated circuit according to claim 7, wherein said further memory unit has programmable elements including laser fuses.

10. The integrated circuit according to claim 1, wherein said terminal of said driver circuit is activated only once when the integrated circuit is taken into operation.

11. The integrated circuit according to claim 1, wherein the signal transmitted on said signal line exhibits only one active phase.

12. The integrated circuit according to claim 1, including a further component and said signal line is connected to said further component.

13. The integrated circuit according to claim 1, wherein at least one of said subcircuits has a dynamic random access memory circuit.

* * * * *